(12) United States Patent
Nitta et al.

(10) Patent No.: US 6,225,230 B1
(45) Date of Patent: *May 1, 2001

(54) METHOD OF MANUFACTURING SEMICONDUCTOR DEVICE

(75) Inventors: Hiroyuki Nitta, Yokohama; Yusuke Kohyama, Yokosuka, both of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/861,736

(22) Filed: May 22, 1997

(30) Foreign Application Priority Data

May 28, 1996 (JP) .................................... 8-133027

(51) Int. Cl.⁷ .............................. H01L 21/00; H01L 21/76

(52) U.S. Cl. ................... 438/700; 438/424; 438/226; 438/426; 438/296

(58) Field of Search ................................. 438/424, 426, 438/700, 226, 296

(56) References Cited

U.S. PATENT DOCUMENTS

| | | | |
|---|---|---|---|
| 4,729,006 | * 3/1988 | Dally | 257/372 |
| 5,298,450 | * 3/1994 | Verret | 438/221 |
| 5,316,965 | * 5/1994 | Philipossian et al. | 438/424 |
| 5,442,211 | * 8/1995 | Kita | 257/301 |
| 5,459,104 | * 10/1995 | Sakai | 438/406 |
| 5,691,215 | * 11/1997 | Dai et al. | 438/424 |
| 5,728,621 | * 3/1998 | Zheng et al. | 438/424 |
| 5,736,462 | * 4/1998 | Takahashi et al. | 438/424 |

FOREIGN PATENT DOCUMENTS

| | | |
|---|---|---|
| 61-16545 | 1/1986 | (JP) . |
| 5-326690 | 12/1993 | (JP) . |
| 6-45432 | 2/1994 | (JP) . |

OTHER PUBLICATIONS

Stanley Wolf Silicon Processing for the VSLI ERA vol. 2 Lattice Press pp. 21 and 48,1990.*

T. Park et al., A Very Simple Trench Isolation (VSTI) Technology with Chemo–Mechanically Polished (CMP) Substrate Si, 1997 Symposium on VLSI Technology Digest of Technical Papers, pp. 121–122.

B. Davari, et al., "A New Planarization Technique Using a Combination of RIE and Chemical Mechanical Polish (CMP)," IEDM, pp. 3.4.1–3.4.4, 1989.

* cited by examiner

*Primary Examiner*—Charles Bowers
*Assistant Examiner*—David S. Blum
(74) *Attorney, Agent, or Firm*—Banner & Witcoff, Ltd.

(57) ABSTRACT

Disclosed is a method of forming an element isolation insulating film by STI (shallow trench isolation) method, which permits effectively preventing a concave portion from being formed in an edge of the element isolation insulating film, permits decreasing the number of treating steps, and also permits facilitating the formation of the element isolation insulating film with a high yield. In forming the element isolation insulating film, a groove is formed in a surface region of a semiconductor substrate, followed by forming an insulating film on the entire surface to fill at least the groove. Then, a flattening treatment is applied at least once to remove the insulating film from the substrate surface such that the insulating film is left unremoved only within the groove. In place of a wet etching treatment, a mirror-polishing method is employed for the last flattening treatment.

6 Claims, 6 Drawing Sheets

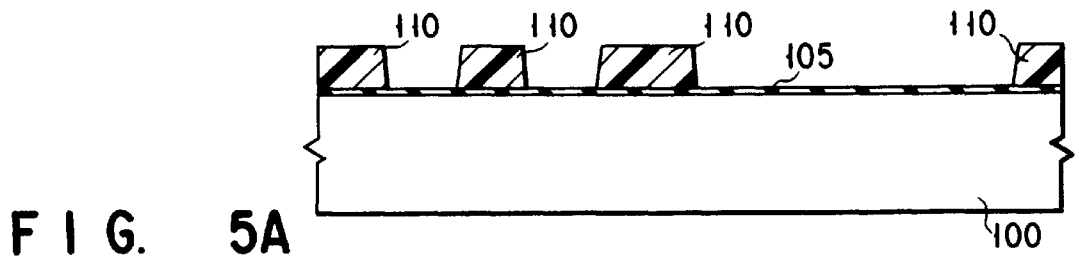
F I G. 5A
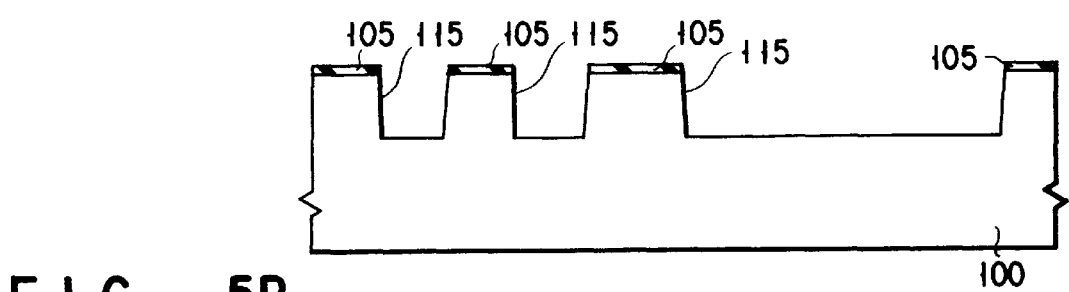
F I G. 5B
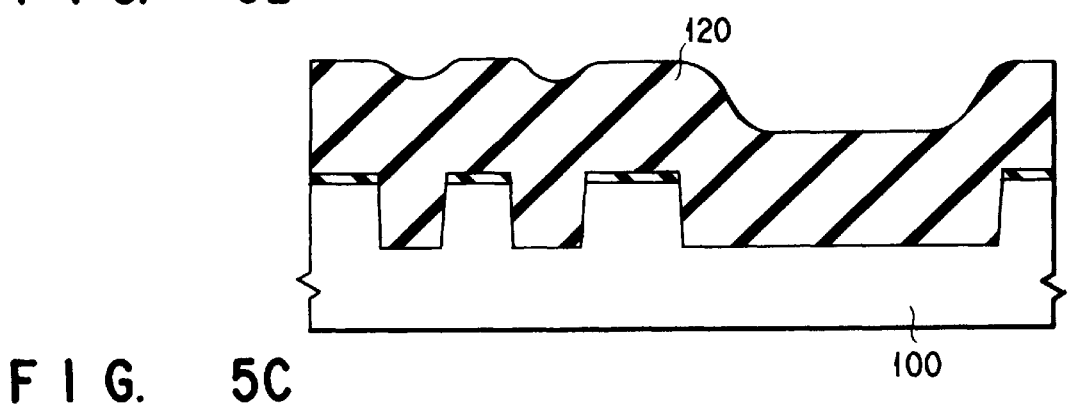
F I G. 5C
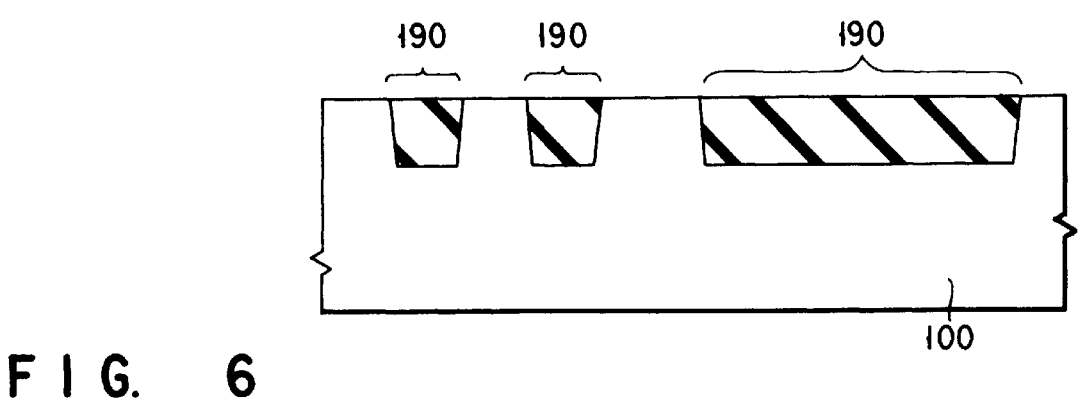
F I G. 6

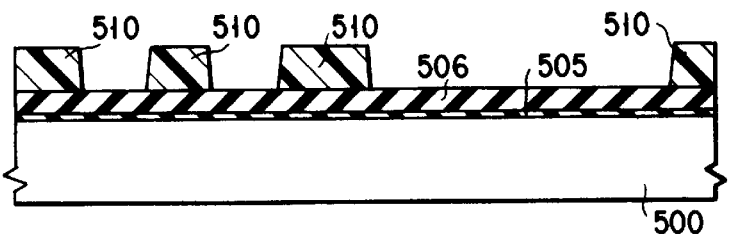
F I G. 9A
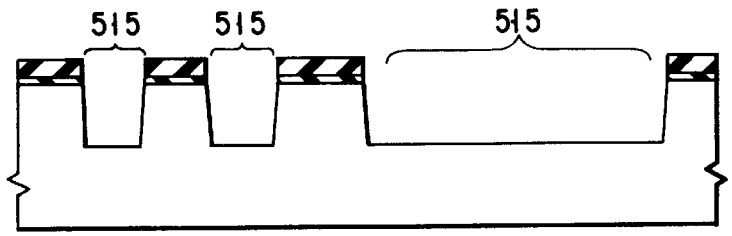
F I G. 9B
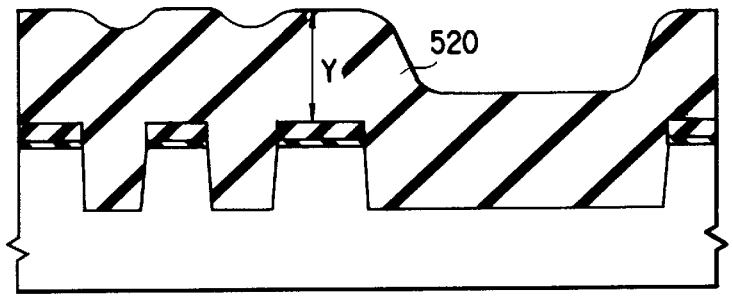
F I G. 9C
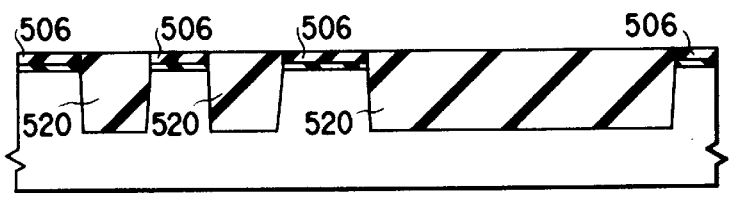
F I G. 10A
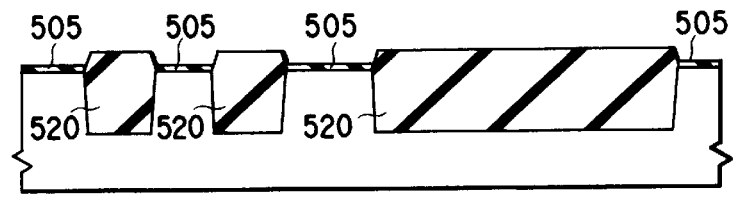
F I G. 10B
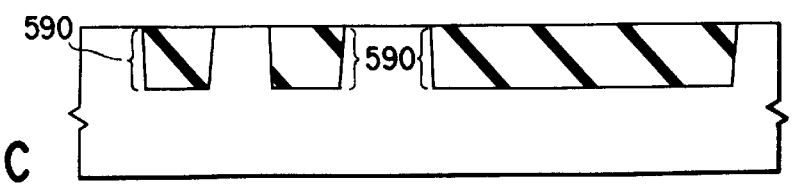
F I G. 10C

METHOD OF MANUFACTURING SEMICONDUCTOR DEVICE

BACKGROUND OF THE INVENTION

The present invention relates to a cell structure of, for example, a dynamic RAM (DRAM), particularly to a method of forming an element isolation insulating film by means of STI (Shallow Trench Isolation).

In recent years, prominent progress is being achieved in a large scale integration of semiconductor devices, particularly DRAM. In accordance with the progress, the area occupied by the unit memory element in the device tends to be markedly diminished. Also, it is unavoidable for the area occupied by the element isolation region to be diminished. Such being the situation, an STI method has come to be used as an element isolation method in place of the known LOCOS (Local Oxidation of Silicon) method.

A conventional STI method is proposed in, for example, B. Davari et al. "A New Planarization Technique Using a Combination of RIE and Chemical Mechanical Polish (CMP)", IEDM, pp. 61–64, 1989. FIGS. 1, 2A to 2C, 3A to 3C and 4 accompanying the present specification collectively exemplify the conventional STI method proposed in this literature.

Specifically, FIG. 1 is a cross sectional view showing that an insulating film 6 for element isolation is selectively formed in a surface region of a semiconductor substrate 1. On the other hand, FIGS. 2A to 2C and 3A to 3C collectively show the conventional STI method of forming the insulating film 6.

As shown in FIG. 2A, a silicon oxide film 2 and a silicon nitride film 3 are formed in the first step on the surface of the semiconductor substrate 1, followed by forming on the silicon nitride film 3 a resist layer 4 in a predetermined pattern by the known lithography method. In the next step, a reactive ion etching (RIE), which is an anisotropic etching method, is applied to the substrate 1, with the resist layer 4 used as a mask, to form an element isolation region 5 in the semiconductor substrate 1, as shown in FIG. 2B. After formation of the element isolation region 5, a silicon oxide-based insulating film 6 is deposited on the entire surface, as shown in FIG. 2C. Further, a dummy pattern 7 is formed above the large element isolation region in order to moderate the surface irregularity taking place after deposition of the insulating film 6.

In the next step, the entire surface is coated with a resist layer, followed by selectively removing the insulating film 6 and the dummy pattern 7 as well as the coated resist layer by RIE and the known CMP (Chemical Mechanical Polish) method, as shown in FIG. 3A. In this step, the silicon nitride film 3 is used as an etching stopper, with the result that the surface of the substrate is flattened. Then, the silicon nitride film 3 is selectively removed by etching, as shown in FIG. 3B.

Finally, a wet etching using a liquid etchant of HF or $NH_4F$ is applied to remove the silicon oxide film 2, with the result that an STI is formed in the semiconductor substrate 1, as shown in FIG. 3C. In this wet etching step, the insulating film 6 is over-etched at the boundary region with the element region because the etching proceeds isotropically, as shown in FIG. 3C.

In general, the insulating film 6 buried in a groove consists of silicon dioxide like the silicon oxide film 2. Therefore, in the wet etching step, the insulating film 6 is partly removed together with the oxide film 2, with the result that a concave portion 15 is formed at the edge of the groove.

Further, a gate insulating film 16 and a polycrystalline silicon layer 17 doped with phosphorus are formed in this order to form a laminate structure on the semiconductor substrate 1 having the STI formed thereon, as shown in FIG. 4. As already described, the concave portion 15 is formed in the edge of the groove. It follows that the laminate structure consisting of the polycrystalline silicon layer 17 and the gate insulating film 16 has a thickness B in the concave portion 15 larger than a thickness A in the other portion.

Further, the polycrystalline silicon layer 17 is coated with a resist layer, followed by selectively applying an anisotropic etching such as RIE to the polycrystalline silicon layer 17 coated with the resist layer to form a striped gate electrode. Still further, an impurity is selectively implanted into the semiconductor substrate 1 so as to form diffusion regions (not shown) used as source and drain regions. In the anisotropic etching step, it is difficult to remove completely the thick polycrystalline silicon layer 17 deposited on the gate insulating film 16. In other words, it is unavoidable for some portion of the polycrystalline silicon layer 17 to be left unremoved on the gate insulating film 16. What should be noted is that the residual polycrystalline silicon layer causes a short-circuit problem between adjacent gate electrodes.

In addition, the conventional STI method requires a large number of treating steps, leading to a high cost and a low yield.

BRIEF SUMMARY OF THE INVENTION

An object of the present invention, which has been achieved in view of the situation described above, is to provide an improved STI method which permits preventing a concave portion from being formed at an edge of an insulating film for an element isolation and also permits decreasing the treating steps so as to facilitate formation of the element isolation insulating film with a high yield.

In the method of the present invention, a groove is formed in a semiconductor substrate, followed by filling at least the groove with an insulating film. Then, a flattening treatment is applied at least once for removing the insulating film from the surface of the semiconductor substrate such that the insulating film is left unremoved within the groove. In the last flattening treatment, a mirror-polishing method is employed in place of the wet etching method which is generally employed.

Since the mirror-polishing method is employed in place of the wet etching method, the insulating film buried in the groove for the element isolation is not excessively removed, with the result that a concave portion in question is not formed in the case of employing the method of the present invention. Naturally, the problem of a residual polycrystalline silicon within the concave portion need not be worried about. It follows that the present invention permits eliminating the short-circuit problem inherent in the conventional STI method between adjacent gate electrodes. In addition, a wet etching treatment which requirs many treating steps is not employed in the present invention. In other words, the method of the present invention permits decreasing the number of treating steps, leading to an improved yield and to a further miniaturization of the semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A to 5C are cross sectional views collectively showing some steps included in a method according to a first embodiment of the present invention;

FIG. 6 is a cross sectional view showing the remaining steps included in the method according to the first embodiment of the present invention;

FIGS. 9A to 9C are cross sectional views collectively showing some steps included in a method according to a fourth embodiment of the present invention;

FIGS. 10A to 10C are cross sectional views collectively showing the remaining steps included in the method according to the fourth embodiment of the present invention.

DETAILED DESCRIPTION OF THE INVENTION

Figure 1:
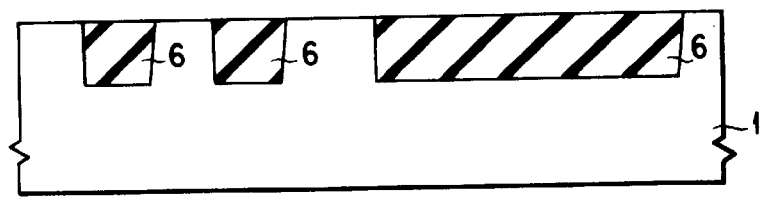
FIG. 1 is a cross sectional view showing an element isolation insulating film.
Figure 2A:
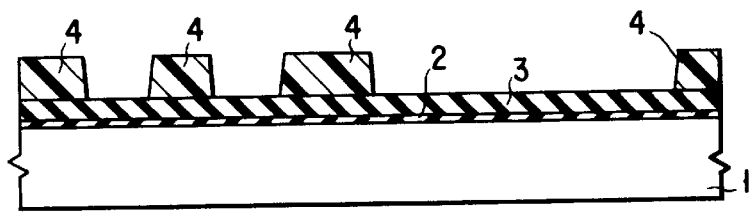
FIGS. 2A to 2C are cross sectional views collectively; showing some steps included in the conventional method of forming an element isolation insulating film.
Figure 2B:
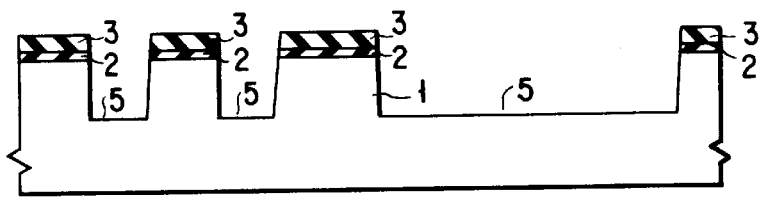
Figure 2C:
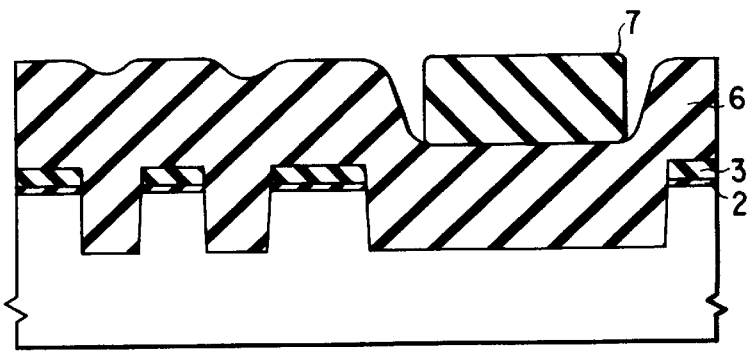
Figure 3A:
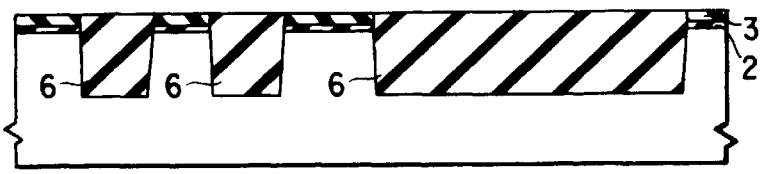
FIGS. 3A to 3C are cross sectional views collectively showing the succeeding steps included in the conventional method of forming an element isolation insulating film.
Figure 3B:
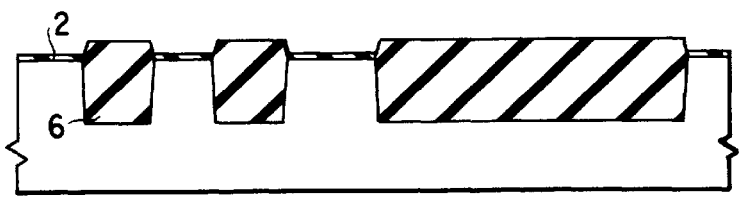
Figure 3C:
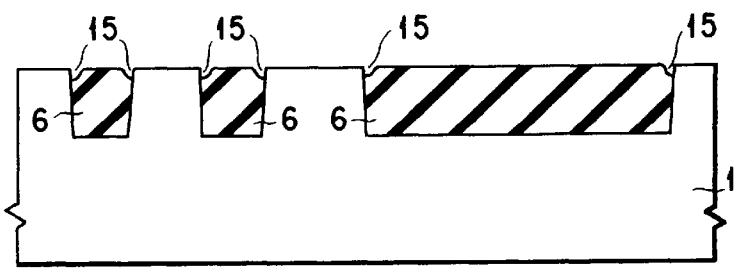
Figure 4:
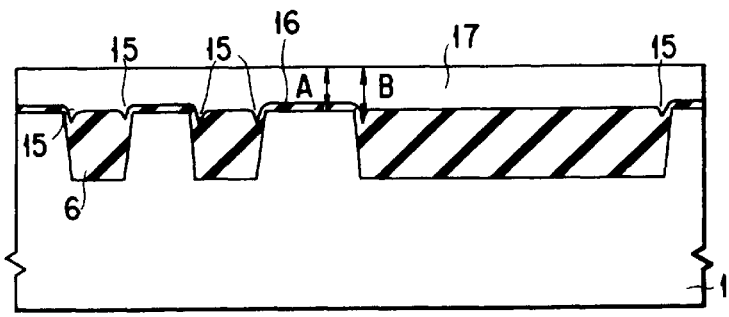
FIG. 4 is a cross sectional view showing the remaining steps included in the conventional method of forming an element isolation insulating film.

Let us describe some embodiments of the present invention with reference to the accompanying drawings. Specifically, FIGS. 5A to 5C collectively show some steps included in a method according to a first embodiment of the present invention. In the first step, a silicon oxide film 105 is formed in a thickness of about 10 nm by thermal oxidation on the surface of a semiconductor substrate 100, as shown in FIG. 5A, followed by coating the oxide film 105 with a resist layer 110. Then, the resist layer 110 is selectively removed by the ordinary lithography method to form a predetermined pattern of the resist layer 110. The oxide film 105 acts as a contamination preventing film for preventing the impurities contained in the resist layer 110 from being diffused into the semiconductor substrate 100 to contaminate the substrate 100. After patterning of the resist layer 110, an element isolation region (or groove) 115 is formed with a depth of about 200 nm by an anisotropic etching method (for example, RIE method) using the patterned resist layer 110 as a mask, followed by removing the resist layer 110, as shown in FIG. 5B. Then, an insulating film 120, e.g., a silicon dioxide film, is deposited with a thickness of about 400 nm by a CVD method on the entire surface including the groove 115, as shown in FIG. 5C. In this step, the insulating film 120 should be deposited to fill completely at least the groove 115.

Further, the insulating film 120 is flattened by a CMP method using the semiconductor substrate 100 as a stopper, as shown in FIG. 6. As a result, the insulating film 120 is left within the groove 115 to form an STI 190. Where the surface of the semiconductor substrate 100 may possibly be damaged in the flattening step, it is desirable to apply a mirror-polishing treatment to the semiconductor substrate 100 for finely polishing the substrate surface after the CMP method. The mirror-polishing treatment permits the surface of the semiconductor substrate 100 to be flattened more satisfactorily. Of course, the mirror-polishing treatment can be omitted, where it is unnecessary to apply a finish polishing by the mirror-polishing treatment. Further, the insulating film 120 can be flattened by only the mirror-polishing treatment.

An abrasive material is used in the CMP method. However, a mixed aqueous solution containing, for example, $NH_4F$ and $Cu(NO_3)_2$, is used in the mirror-polishing treatment in place of an abrasive material.

As known to the art, an abrasive material, e.g., alumina, is used in the CMP method. In this case, the abrasive material firmly bites into the surface region of the semiconductor substrate, making it difficult to remove the abrasive material from the substrate surface even if the substrate surface is washed by applying an ultrasonic wave using an organic solvent or pure water. In addition, the surface of the semiconductor substrate is damaged by the abrasive material.

To overcome the above-noted difficulty, it was customary in the past to employ a wet etching treatment, in which the substrate is dipped in a chemical solution, for flattening the semiconductor substrate surface. In the wet etching, however, the insulating film buried in the groove is also etched with the chemical solution, resulting in formation of a concave portion at an edge of the groove. On the other hand, a mirror-polishing method is employed in the present invention. Since an apparatus equal to that used in the CMP method can be used in applying the mirror-polishing treatment, a new apparatus need not be used for the finish flattening treatment in the present invention.

Further, in the conventional method, a silicon nitride film is used as a member for stopping the polishing (or flattening) treatment. In the present invention, however, the semiconductor substrate 100 is used as a stopper, leading to a shortened treating step. In addition, it is possible to form an element isolation insulating film having a flat surface.

Figure 7A:
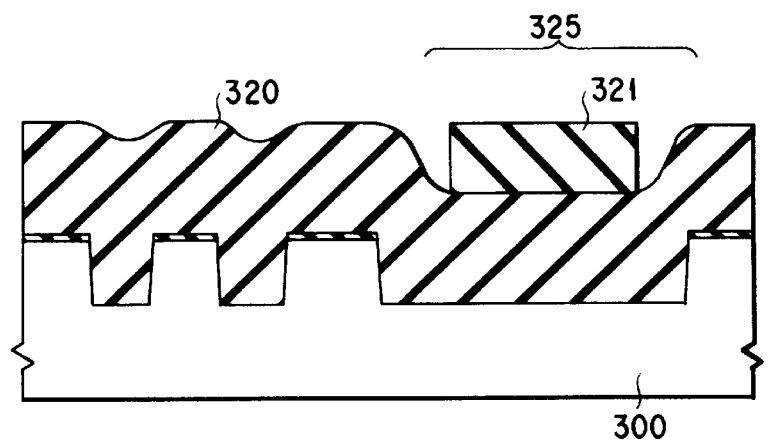
FIGS. 7A and 7B are cross sectional views collectively showing a method according to a second embodiment of the present invention.
Figure 7B:
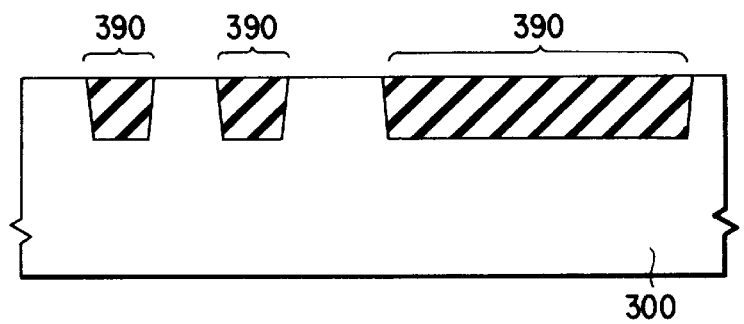

FIGS. 7A and 7B collectively show a method according to a second embodiment of the present invention. As apparent from FIG. 7A, the second embodiment is equal to the first embodiment up to the step shown in FIG. 5C. Then, in the second embodiment, a dummy pattern 321 is formed in a groove portion 325 after deposition of an insulating film 320, as shown in FIG. 7A. In the next step, a flattening treatment is performed by means of a CMP method using a semiconductor substrate 300 as a stopper so as to form an STI 390 buried in the insulating film, as shown in FIG. 7B. In this embodiment, the material of the dummy pattern 321 should be substantially equal to that of the insulating film 320 in the polishing selectivity ratio. Further, a mirror-polishing treatment should be performed, if necessary, after the CMP process.

In the second embodiment described above, a dummy pattern is formed in the groove portion 325 occurring in the insulating film 320, as described above, with the result that the flattening treatment by the CMP method can be performed easily.

Figure 8A:
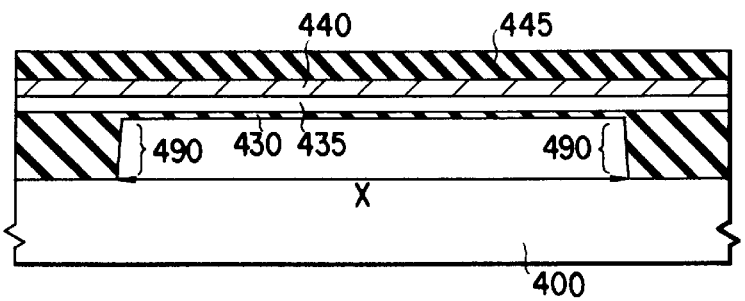
FIGS. 8A and 8B are cross sectional views collectively showing a method according to a third embodiment of the present invention.
Figure 8B:
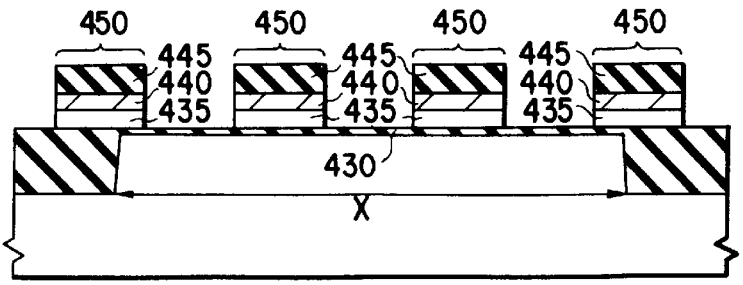

FIGS. 8A and 8B collectively show a method according to a third embodiment of the present invention. As apparent from FIG. 8A, at least two STI's 490 are formed a predetermined distance X apart from each other as in the first or second embodiment described above. Then, a gate oxide film 430 is formed on a semiconductor substrate 400 in a thickness of about 6 nm by thermal oxidation, followed by forming a polycrystalline silicon film 435 by a CVD method with a thickness of about 70 nm on the gate oxide film 430. The polycrystalline silicon film 435 is doped with phosphorus. Further, a tungsten silicide film 440 is formed by a sputtering method in a thickness of about 70 nm on the polycrystalline silicon film 435, followed by forming a silicon nitride film 445 on the tungsten silicide film 440 by a CVD method in a thickness of about 150 nm.

In the next step, the silicon nitride film 445, the tungsten silicide film 440 and the polycrystalline silicon film 435 are successively etched selectively by a photoetching method so as to form at least two gate electrodes 450, as shown in FIG. 8B. Further, an impurity is implanted into the substrate for forming impurity diffusion layers (not shown) acting as source and drain regions, thereby to prepare a desired semiconductor device. Incidentally, the resultant semiconductor device includes, for example, a memory cell such as DRAM.

In the third embodiment described above, a wet etching is not employed in the flattening treatment in the step of forming the STI 490. This makes it possible to suppress formation of a concave portion in an edge of the insulating film constituting the STI 490. As a result, polycrystalline silicon does not remain on the STI 490 before the step of forming the gate electrode 450. It follows that it is possible to prevent short-circuit between the gate electrode 450 and another gate electrode (not shown). Also, since formation of the particular concave portion can be suppressed, it is possible to suppress disturbance of an electric field in the concave portion in question. This makes it possible to shorten the distance X between two adjacent STI's 490, leading to further miniaturization of the resultant semiconductor device.

FIGS. 9A to 9C and 10A to 10C collectively show a method according to a fourth embodiment of the present invention. In the first step, a silicon oxide film 505 is formed with a thickness of about 10 nm by thermal oxidation on the surface of a semiconductor substrate 500, as shown in FIG. 9A. Then, a silicon nitride film 506 is deposited with a thickness of about 60 nm by a CVD method on the oxide film 505, followed by forming a resist layer 510 of a predetermined pattern on the nitride film 506.

In the next step, an anisotropic etching, e.g., RIE, is applied with the resist layer 510 used as a mask so as to remove the nitride layer 506, the oxide layer 505 and an upper region of the semiconductor substrate 500, as shown in FIG. 9B. As a result, grooves 515 for element isolation are formed. After formation of the groove 515, the resist layer 510 is removed, followed by depositing a silicon oxide series insulating material, e.g., silicon dioxide, by a CVD method on the entire surface of the substrate such that at least the grooves 515 for element isolation are completely filled with the resultant insulating film 520.

Then, the substrate surface is flattened (first flattening) by a CMP method using the silicon nitride film 506 as a stopper, as shown in FIG. 10A, followed by selectively removing the silicon nitride film 506 by a chemical dry etching (CDE) method using a CF$_4$ series gas, as shown in FIG. 10B. Finally, a flattening treatment (second flattening) is performed by means of a mirror-polishing method with the semiconductor substrate 500 used as a stopper so as to form an STI 590 as shown in FIG. 10C.

In the fourth embodiment described above, the second flattening treatment is performed by means of a mirror-polishing method. Alternatively, it is also possible to once expose the surface of the semiconductor substrate 500 by a CMP method, followed by applying a mirror-polishing treatment for the flattening purpose in order to prevent the substrate surface from being roughened.

It is also possible to implant an impurity into a surface region of the semiconductor substrate 500 for forming a channel region (not shown) in the element region after removal of the patterned resist layer 510 shown in FIG. 9A or after removal of the silicon nitride film 506 shown in FIG. 10A. Further, it is possible to form a dummy insulating film (not shown) in the groove portion of the insulating film 520 shown in FIG. 9C. In this case, it is desirable for the dummy insulating film to be substantially equal in the polishing selectivity ratio to the insulating film 520.

In the fourth embodiment described above, a wet etching is not employed in the finish flattening treatment in the step of forming the STI 590. This makes it possible to suppress formation of a concave portion in an edge of the insulating film 520 constituting the STI 590. Also, in the fourth embodiment, the insulating film 520 is roughly flattened once by a CMP method so as to expose the silicon nitride film 506. Also, a mirror-polishing method is employed for the finish flattening treatment.

Where the silicon oxide film 520 has a large thickness Y shown in FIG. 9C, it is advisable in shortening the processing time to apply once a CMP method for a rapid rough polishing.

Further, the conventional flattening process by means of a wet etching requires, in general, several steps. However, the finish flattening by the mirror-polishing as in the fourth embodiment of the present invention permits decreasing the number of required steps.

What should also be noted is that the mirror-polishing method can be performed by using the apparatus used for the CMP method as already pointed out, leading to a cost saving in forming an element isolation insulating film.

Further, in the step of impurity implantation into the substrate after removal of the silicon nitride film 506 shown in FIG. 10B, the oxide film 520 is used as a mask. Also, the protective film 505 acts as a sacrificial layer. It follows that an element isolation insulating film free from a concave portion can be formed after an impurity implantation in a self-aligned fashion. It should be noted in this connection that the protective film 505 acts as a sacrificial layer in this step, with the result that a sacrificial layer need not be newly formed in the subsequent ion implantation step.

Figure 11A:
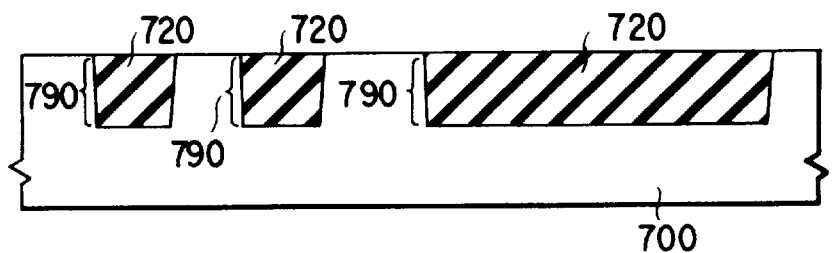
FIGS. 11A to 11C are cross sectional views collectively showing a method according to a fifth embodiment of the present invention.
Figure 11B:
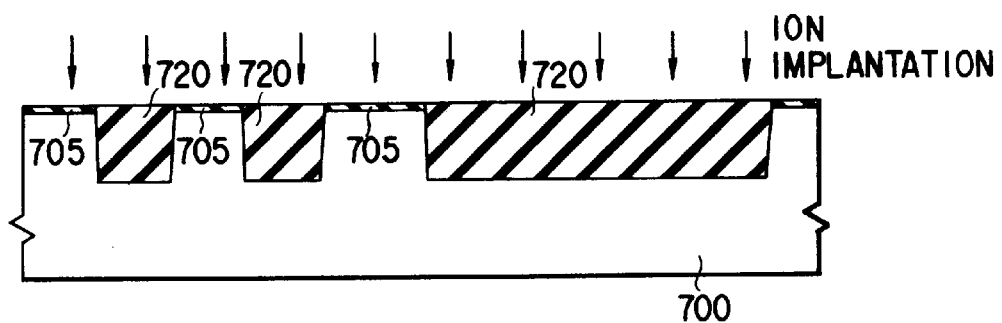
Figure 11C:
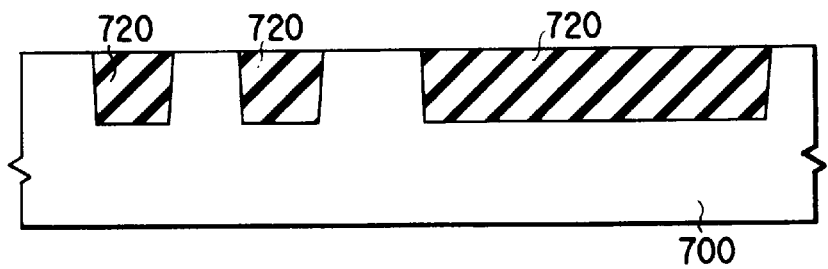

FIGS. 11A to 11C collectively show a method according to a fifth embodiment of the present invention. In this embodiment, an insulating film, e.g., a silicon dioxide film, constituting an STI 790 is formed in a surface region of a semiconductor substrate 700 as shown in FIG. 11A. The STI 790 is formed by the method described previously.

In the next step, a silicon oxide film 705 is formed with a thickness of about 6 nm by thermal oxidation, as shown in FIG. 11B, followed by ion implantation into the substrate 700 for forming a well, a channel stopper, a channel, etc. In this ion implantation step, the oxide film 705 acts as a sacrificial layer.

Further, the oxide film 705 is removed by a CMP method using the semiconductor substrate 700 as a stopper, followed by a finish polishing by a mirror-polishing method for the surface flattening purpose, as shown in FIG. 11C. Incidentally, the oxide film 705 may be formed by a CVD method. Also, it is possible to employ the mirror-polishing treatment alone for the surface flattening purpose.

In the fifth embodiment described above, the sacrificial layer 705 for protecting the surface of the semiconductor substrate 700 in the ion implantation step is removed by a mirror-polishing method alone or by combination of a CMP method and a mirror-polishing method. In other words, a wet etching is not employed for removing the protective film 705. It follows that the oxide film constituting the STI 790 is not deformed at an edge portion. Further, the fifth embodiment permits simplifying the process for forming an STI, as already described in conjunction with the other embodiments of the present invention.

As described herein in detail, a mirror-polishing method is employed in the method of the present invention in place of a conventional wet etching treatment for the finish flattening step. As a result, the insulating film buried in a groove for an element isolation is not excessively removed and, thus, a concave portion is not formed in an edge of the insulating film.

Further, the wet etching treatment necessitates many treating steps. Naturally, the method of the present invention, which does not employ the wet etching treatment, permits markedly decreasing the number of treating steps required for forming an STI. It follows that the yield can be improved. In addition, the semiconductor chip can be miniaturized.

Additional advantages and modifications will readily occur to those skilled in the art. Therefore, the invention in its broader aspects is not limited to the specific details and representative embodiments, shown and described herein. Accordingly, various modifications may be made without departing from the spirit or scope of the general inventive concept as defined by the appended claims and their equivalents.

What is claimed is:

1. A method of manufacturing a semiconductor device having a groove for element isolation formed in a semiconductor substrate and also having an insulating film buried in said groove, comprising the steps of:

forming a protective film on a semiconductor substrate for protecting said semiconductor substrate;

selectively removing a surface region of said semiconductor substrate and said protective film so as to form a groove, said surface region being an element isolation region;

forming an insulating film to fill completely at least said groove; and flattening said insulating film by a CMP method with said semiconductor substrate used as stopper so as to leave said insulating film within said groove and remove said protective film at the same time.

2. The method of manufacturing a semiconductor device according to claim 1, further comprising the steps of:

forming a patterned resist layer on said protective film, between the step of forming a protective film on a semiconductor substrate and the step of selectively removing a surface region of said semiconductor substrate and said protective film, and removing said patterned resist layer, between the steps of selectively removing a surface region of the semiconductor substrate and said protective film and the steps of forming an insulating film to completely fill at least said groove, wherein the step of selectively removing a surface region and said protective film includes the step of removing the surface region and protective film surface region and protective film by means of an anisotropic etching using said patterned resist layer as a mask.

3. A method of manufacturing a semiconductor device having an insulating film buried in a groove formed in a semiconductor substrate for an element isolation, comprising the steps of forming a protective film on said semiconductor substrate to protect said substrate;

selectively removing a surface region of said substrate and said protective film so as to form a groove, said surface region being an element isolation region;

forming an insulating film on an entire surface to fill at least said groove;

roughly flattening a surface of said insulating film by flattening means such that said semiconductor substrate is not exposed; and finely flattening said insulating film while removing said protective film by a mirror-polishing method so as to expose said semiconductor substrate.

4. The method of manufacturing a semiconductor device according to claim 3, further comprising the steps of:

coating said protective film with a resist layer, followed by patterning said resist layer by a lithographic method, between the step of forming a protective film on said semiconductor substrate and the step of selectively removing a surface region of said substrate and said protective film, and removing said patterned resist layer, between the steps of selectively removing a surface region of the semiconductor substrate and said protective film and the steps of forming an insulating film on an entire surface to fill at least said groove, wherein the step of selectively removing a surface region and said protective film includes the step of removing the surface region and protective film by means of an anisotropic etching with said patterned resist layer as a mask.

5. A method of manufacturing a semiconductor device, comprising the steps of:

forming a laminate structure consisting of a first insulating film and a stopper film on a surface of a semiconductor substrate, followed by selectively removing said laminate structure and a surface region of said semiconductor substrate to form a groove extending into said semiconductor substrate and subsequently forming a second insulating film to fill at least said groove;

flattening said second insulating film to expose a surface of said stopper film;

removing said stopper film; and flattening said second insulating film while removing said first film by a mirror-polishing method to expose said semiconductor substrate.

6. A method of manufacturing a semiconductor device, comprising the steps of:

forming a first insulating film on a surface of a semiconductor substrate;

forming a stopper film on said first insulating film;

selectively removing said stopper film, said first insulating film and a surface region of said semiconductor substrate to form a groove in said semiconductor substrate;

forming a second insulating film to fill at least said groove;

flattening said second insulating film to expose said stopper film;

removing said stopper film; and finely flattening by a mirror-polishing method said second insulating film while removing said first insulating film until said semiconductor substrate is exposed.

* * * * *